United States Patent
Tsai et al.

(10) Patent No.: US 6,251,791 B1
(45) Date of Patent: Jun. 26, 2001

(54) ELIMINATING ETCHING MICROLOADING EFFECT BY IN SITU DEPOSITION AND ETCHING

(75) Inventors: Ming-Huan Tsai, Chu-Pei; Chan-Lon Yang, Taipei, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/357,246

(22) Filed: Jul. 20, 1999

(51) Int. Cl.[7] .................................................. H01L 21/311
(52) U.S. Cl. ....................................................... 438/700
(58) Field of Search ..................................... 438/712, 700

(56) References Cited

U.S. PATENT DOCUMENTS

| | | | | |
|---|---|---|---|---|
| 4,385,975 | * | 5/1983 | Chang | 438/427 |
| 4,784,720 | * | 11/1988 | Douglas | 438/695 |
| 4,838,978 | * | 6/1989 | Sekine et al. | 156/345 |
| 5,236,863 | * | 8/1993 | Iranmensh | 438/429 |
| 5,302,882 | * | 4/1994 | Miller | 315/111.21 |
| 5,354,421 | * | 10/1994 | Tatsumi et al. | 438/695 |
| 5,413,966 | * | 5/1995 | Schoenborn | 438/421 |
| 5,670,401 | * | 9/1997 | Tseng | 438/291 |
| 5,729,563 | * | 3/1998 | Wang et al. | 372/50 |
| 5,811,357 | * | 9/1998 | Armacost et al. | 438/723 |
| 5,814,547 | * | 9/1998 | Chang | 438/329 |

* cited by examiner

Primary Examiner—Benjamin L. Utech
Assistant Examiner—Lynette T. Umez-Eronini

(57) ABSTRACT

A method for eliminating the etching microloading effect is proposed for the invention. Spirit of the invention is that a coating layer is formed on a photo-resist that covers a substrate before the substrate is etched, where coating layer maybe a polymer layer or a dielectric layer. Because step coverage of the coating layer is limited by the aspect of trench, for photo-resist it means the width of openings, it is indisputable that depth of coating layer on bottom of a narrow opening is smaller than depth of coating layer on bottom of a wide opening. Therefore, during following etching process, although etching microloading effect induces etching rate is higher in the wide opening and is lower in the narrow opening, but the thicker coating layer on bottom of the wide opening also requires larger etching time than the narrow opening. Consequently, it is crystal-clear that the etching microloading effect is cancelled and then depth of the wide trench is equal to depth of the narrow trench.

19 Claims, 4 Drawing Sheets

ELIMINATING ETCHING MICROLOADING EFFECT BY IN SITU DEPOSITION AND ETCHING

BACKGROUND OF THE INVENTION

1. Field of the Invention

The proposed invention relates to a method for eliminating the etching microloading effect, and more particularly to a method of forming wide and narrow trenches with same depth simultaneously.

2. Description of the Prior Art

In most of practical semiconductor fabrications, there are a plurality of elements in a layer of an integrated circuit and each element has individual shape and size. When an etching process is used to form these elements, fabrication of these elements comprises following steps:

First, a photo-resist is formed on the layer with many openings where each opening corresponds to a specific element.

Second, effecting an etching process to etch the layer and to form a plurality of trenches in said layer, where each trench corresponds to a specific element.

Third, performing following fabrication such as depositing to completely form these elements.

It should be noted that because the distance between any two adjacent layers is fixed in a multi-layer integrated circuit, depth of any the underlying layer maybe are destroyed by these trenches. This is a primary restriction of formation of these trenches.

No matter how, the primary restriction is violated by the key technical issue for the plasma etching process: the etching microloading effect. The etching microloading effect means that when ions do not totally vertically collide to a substrate, the colliding probability of a wide trench is higher that the colliding probability of a narrow trench, then both etching rate and depth of any trench are different to each other.

Refer to FIG. 1A where the mechanism of the etching microloading effect is briefly explained in the provided example. As FIG. 1A shows, dielectric layer 10 is formed on substrate 11, where substrate 11 comprises metal oxide semiconductor transistor and isolation. And when integrated circuit is a multi-layer integrated circuit, substrate 11 further comprises a multi-layer trench with a plurality of dielectric layers, a plurality of contacts and a plurality of interconnects. On the surface of dielectric layer 10, photo-resist 12 is formed with first opening 13 and second opening 14, where width (W1) of first opening 13 is smaller than width (W2) of second opening 14.

Owing to the ability of available plasma reactor, it is obvious that during an etching process, ions 15 do not totally vertically collide dielectric 10. Therefore, the wider width of second opening 14 increases the probability that inclined incident ions 15 collide to dielectric layer 10. And the result is the etching rate is larger in second opening 14 but is lower in first opening 13. The phenomenon is known as the etching microloading effect.

Consequently, the result of the etching microloading effect is shown in FIG. 1B. Obviously, first trench 16 that corresponds to first opening 13 is shallow and second trench 17 that corresponds to second opening 14 is deep. Therefore, either second trench 17 just touches substrate 11 but first trench 16 does not touch substrate 11, or first trench 16 just touches substrate 11 but second trench 17 penetrates substrate 11 and maybe be destroy some structure inside substrate 11.

According to previous discussion, it is obvious that etching microloading effect is serious and it is desired to develop a method for forming a plurality trenches with same depth but individual width.

SUMMARY OF THE INVENTION

A principal object of the present invention is to provide an effective and manufacturable method for forming both wide and narrow trenches with same depth simultaneously.

Another object of the present invention is to provide a method of forming different trenches with same depth by pre-forming a coating layer on a photo-resist.

A further object of the present invention is to provide a method that not only eliminates disadvantages of the etching microloading but also keep throughput in a high level.

In order to realize these objects of this invention, a method for eliminating the etching microloading effect is proposed. In the method, a coating layer is deposited on a photo-resist that covers a substrate before an etching process is perform. Because step coverage of the coating layer is limited by the aspect of opening of photo-resist, indisputably, depth of coating layer on bottom of a narrow opening is smaller than depth of coating layer on bottom of a wide opening. By the way, during following etching process, although etching microloading effect induces etching rate is higher in the wide opening and is lower in the narrow opening, but the thicker coating layer on bottom of the wide opening also requires larger etching time than the narrow opening. Then it is possible to form wide trench and narrow trench in the dielectric layer with same depth simultaneously.

BRIEF DESCRIPTION OF THE DRAWINGS

In the accompanying drawing forming a material part of this description, there is shown.

DESCRIPTION OF THE PREFERRED EMBODIMENT

In order to detail explain the invention, some figures are used to illustrate different steps of an embodiment of the proposed invention and are discussed in following paragraphs. The provided embodiment is a method for forming a narrow contact hole and a wide trench simultaneously in the fabrication of an integrated circuit, where depth of said narrow contact hole is equal to depth of said wide trench.

Figure 1A:
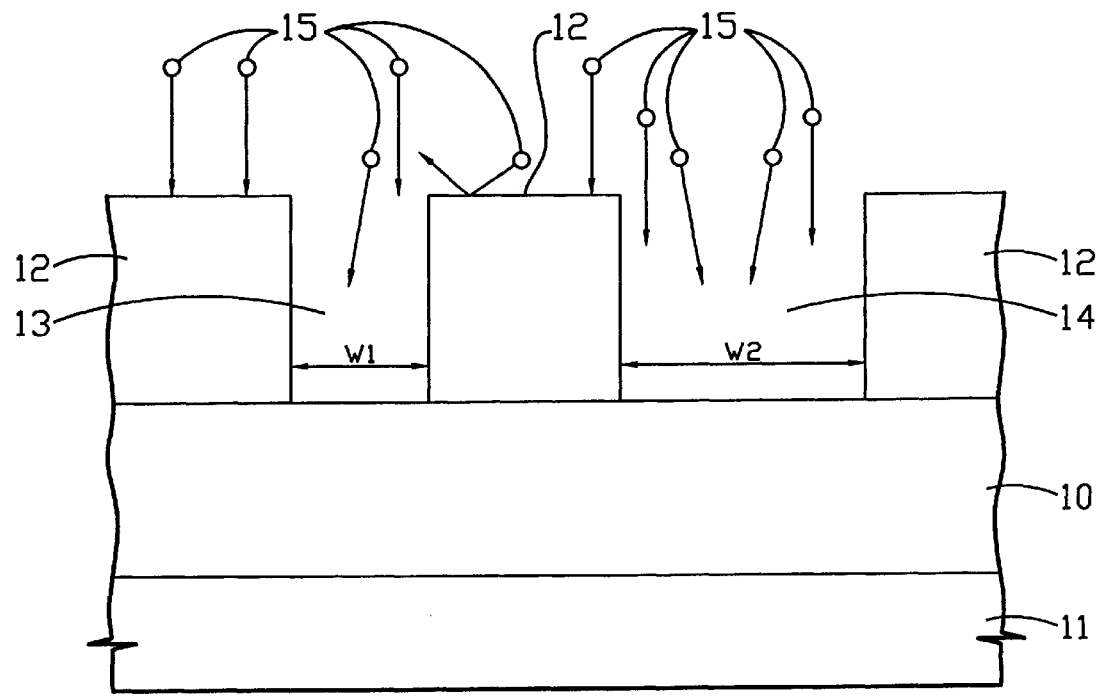
FIG. 1A briefly illustrates the mechanism of the etching microloading effect.
Figure 1B:
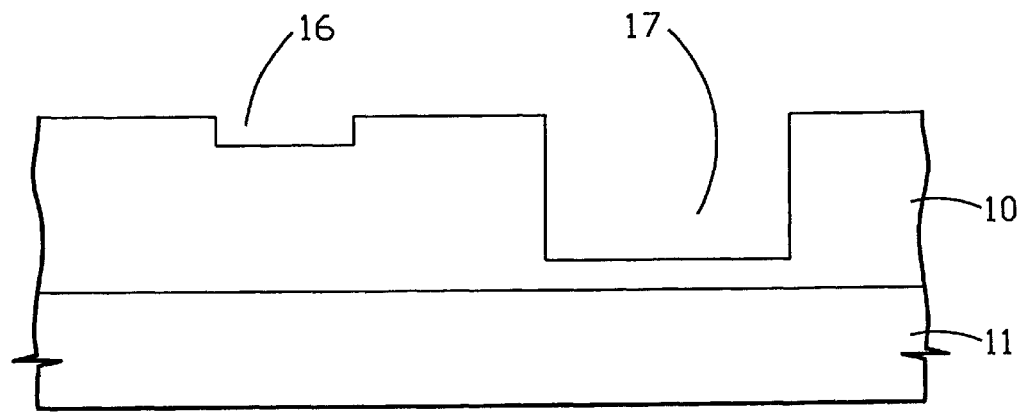
FIG. 1B shows the result of the etching microloading effect.
Figure 2A:
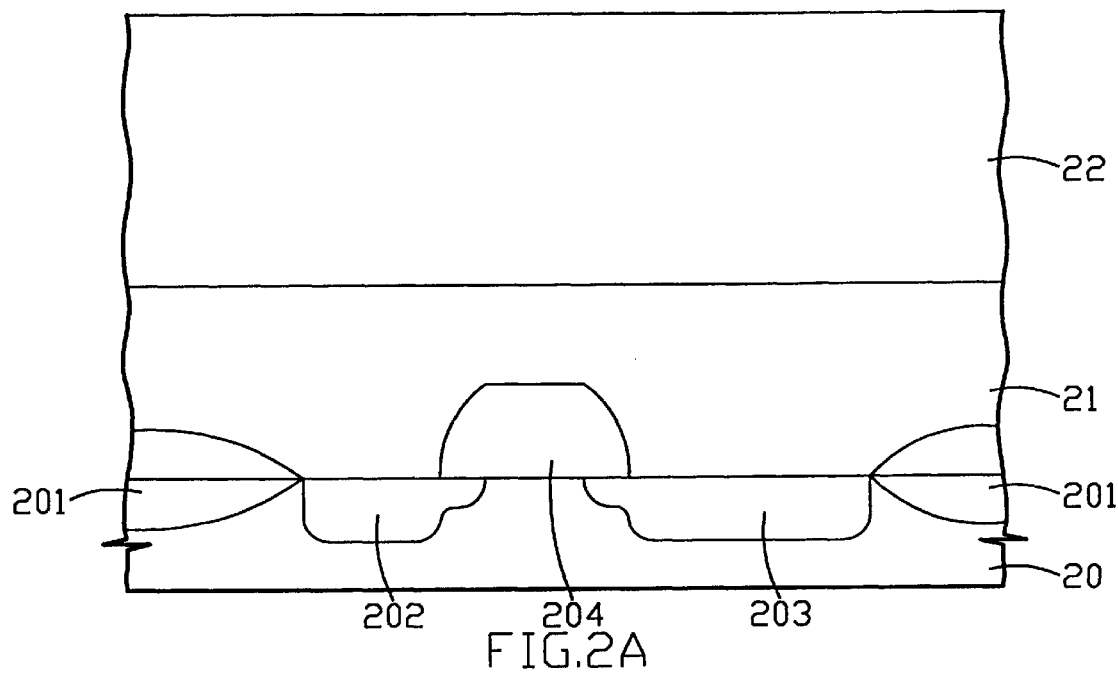
FIG. 2A to FIG. 2E are a series of qualitative cross-section illustrations about steps of one embodiment of the invention.

First, as shown in FIG. 2A, substrate 20 is provided and substrate 20 comprises isolation 201 and elements of metal oxide semiconductor transistor such as source 202, drain 203 and gate 204. Then dielectric layer 21 is formed on substrate 20 and photo-resist 22 is formed on dielectric layer 21 one after another. Moreover, when the embodiment is used to form a multi-layer integrated circuit, substrate 20 further comprises a plurality of dielectric layers, a plurality of contacts and a plurality of interconnects.

Figure 2B:
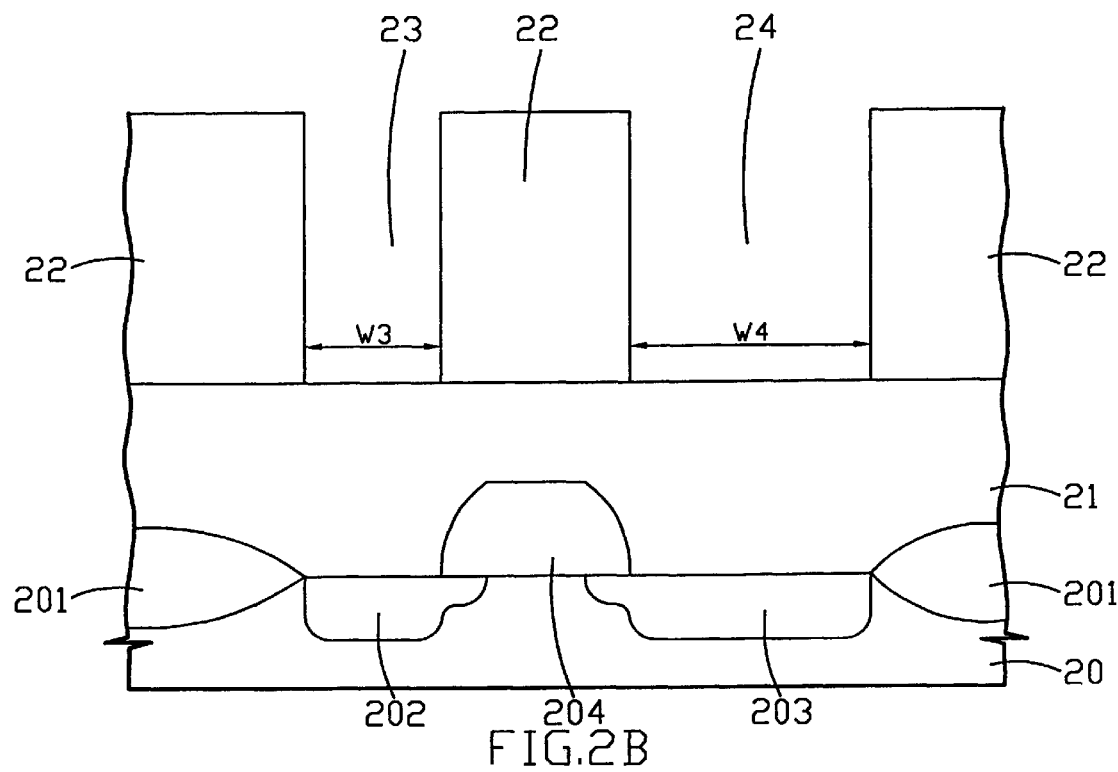

Second, as FIG. 2B shows, a photolithography process is effected to form first opening 23 and second opening 24 in photo-resist 22, where first opening 23 has a first width (W3) and second opening 24 has a second width (W4). Moreover, second width (W4) is larger than said first width (W3). In addition, thickness of photo-resist 22 is from about several angstroms to about several $\mu$ms.

Figure 2C:
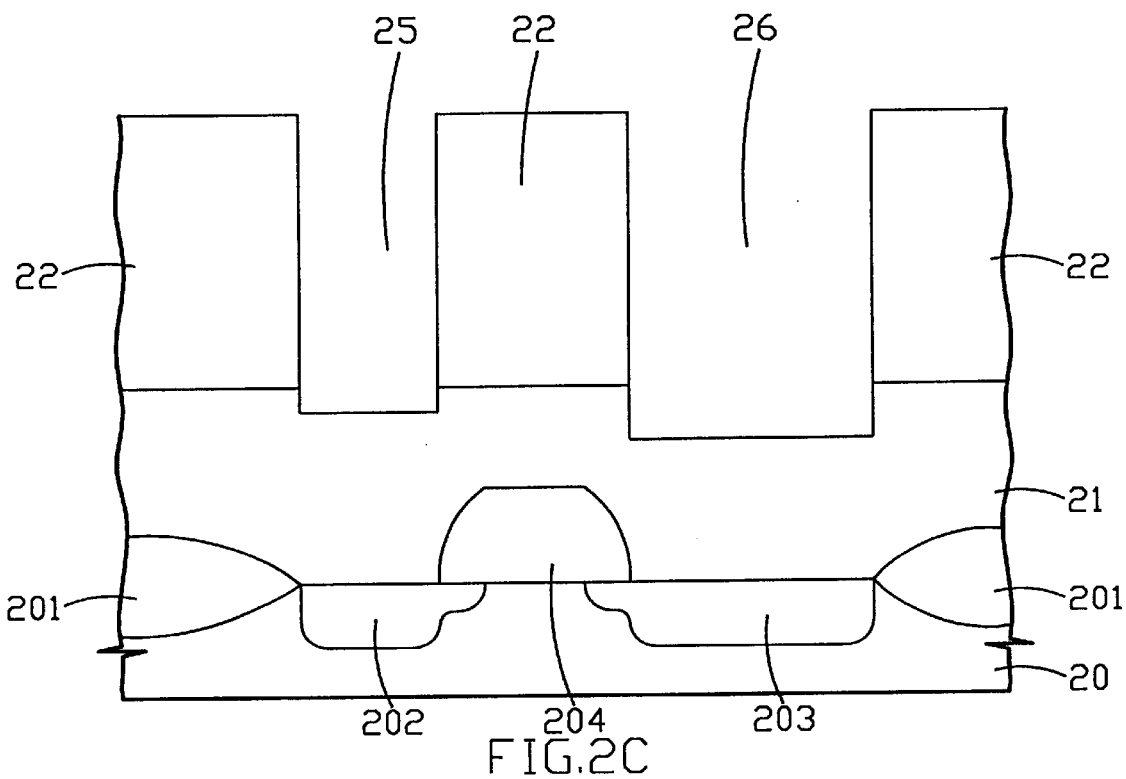

Third, refers to both FIG. 2C and FIG. 2B, a partial etching process is effected to etch part of dielectric layer 21, then narrow contact hole miniature form 25 is formed under first opening 23 and wide trench miniature form 26 is formed under second opening 24. Herein, purpose of partial etching process is to enhance aspect of both first opening 23 and second opening 23 by etching part of dielectric layer 21 which locates under both said opening 23 and second opening 24. Moreover, owing to a known micro-loading effect, depth of narrow contact hole miniature form 25 is smaller than depth of wide trench miniature form.

Figure 2D:
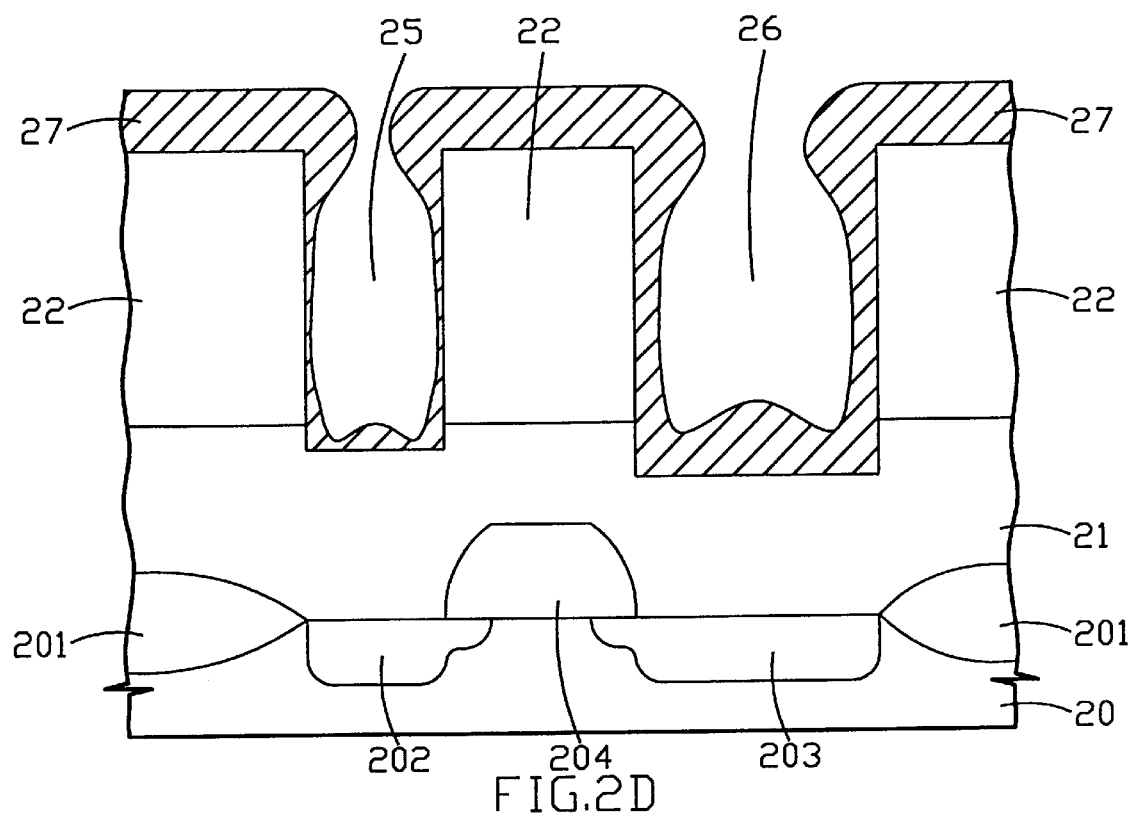

Fourth, as shown in FIG. 2D, coating layer 27 is formed on dielectric layer 21, and fills both narrow contact hole miniature form 25 and wide trench miniature form 26. Because the aspect of narrow contact hole miniature form 25 is larger than aspect of wide trench miniature form 26, depth of coating 27 layer on bottom of narrow contact hole miniature form 25 is smaller than depth of coating layer 27 on bottom of wide trench miniature form 26. Obviously, the depth difference is proportion to the difference of aspect, and the effect of partial etching process is to increase the depth difference. Moreover, varieties of coating layer 27 comprises polymer and dielectric layer, and available polymer layer comprises carbon fluoride, carbon hydrogen fluoride and carbide. And method of forming said coating layer comprises a chemical vapor deposition.

Figure 2E:
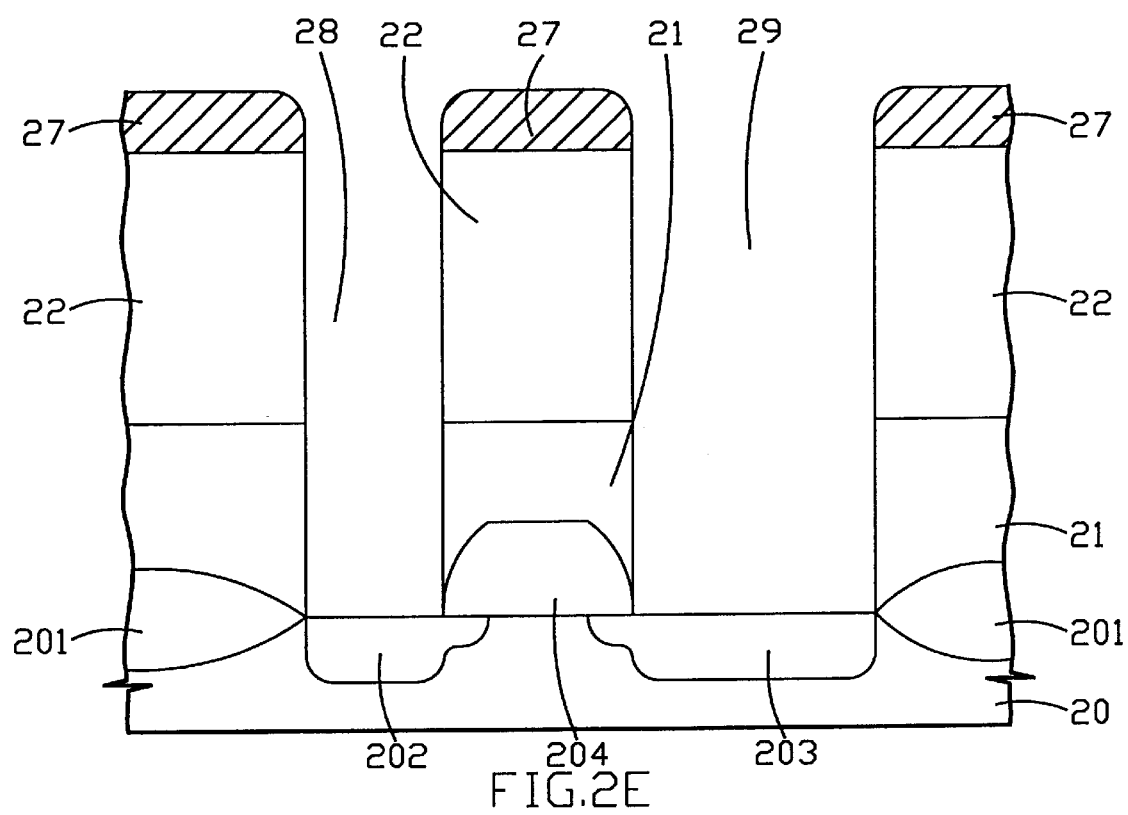

Fifth, as FIG. 2E shows, an etching process is effected to etch both narrow contact hole miniature form 25 and wide trench miniature form 26. Therefore, narrow contact hole 28 and wide trench 29 are formed in dielectric layer 21 and directly contact with substrate 20.

Finally, excess photo-resist 22.

Obviously, difference of etching rate between narrow contact hole miniature form 25 and wide trench miniature form 26 is cancelled by a difference of depth of coating layer 27 between bottom of narrow contact hole miniature form 25 and bottom of wide trench miniature form 26. Therefore, depth of narrow contact hole 28 is equal to depth of wide trench 29.

Consequently, the pivotal point of invention is to appropriately adjust the depth of coating layer 27 such that the effect of different etching rate is effectively cancelled. Beside, the difference of depth of coating layer 27 can be increased by the partial etching process.

Afterward, an application of the proposed method is explained by following paragraphs. Here the provided application is relates to a method for eliminate an etching microloading effect by an In Situ polymer deposition and etching for a semiconductor fabricating process. Because most of steps and contents of the application are similar to the previous embodiment, only differences are vestiged in following paragraphs.

(1) Substrate is a semiconductor substrate.

(2) When the semiconductor substrate is covered by a dielectric layer, the semiconductor substrate is put into a plasma reactor with at least two independent power sources. Here, a first power source is used to generate a plasma in the plasma reactor, and a second power source is used to induce a DC bias near surface of the semiconductor substrate.

(3) Varieties of the first power source comprise radio frequency power of inductance coil and radio frequency power of capacitance plates. On the other hand, variety of said second power source comprises radio frequency power of cathode.

(4) Coating layer is a polymer layer.

(5) The partial etching process is not necessary, it is an optional process before formation of polymer layer by a depositing process. When the partial etching process is performed, the aspect ratio between the wide opening and narrow opening is increased. Of course, the relation between depth of the polymer layer and period of the etching process is strongly dependent on both whether the partial etching process is performed and the degree of the performed partial etching process.

(6) Varieties of semiconductor fabricating process comprises a local interconnects etching process and a dual damascene etching process, where both processes require to form small contact hole and larger open area with same depth. In addition, a typical width of said narrowing opening is smaller than 0.3 $\mu$ms, and a typical width of said wide opening is larger than about 1 $\mu$ms.

Obviously, an important advantage of the application is that etching process and deposition of polymer layer can be performed in same machine: plasma reactor with at least two independent power sources. By the way, not only required machine is saved but also efficiency of the proposed method is further improved.

Although specific embodiments have been illustrated and described, it will be obvious to those skilled in the art that various modifications may be made without departing from what is intended to be limited solely by the appended claims.

What is claimed is:

1. A method for forming a narrow contact hole and a wide trench simultaneously in the fabrication of an integrated circuit, where the depth of said narrow contact hole is equal to the depth of said wide trench, said method comprising following steps:

providing a substrate;

forming a dielectric layer on said substrate;

forming a photo-resist on said dielectric layer;

effecting a photolithography process to form a first opening and a second opening in said photo-resist, where said first opening has a first width and said second opening has a second width which is larger than said first width;

effecting a partial etching process to etch part of said dielectric layer, and then a narrow contact hole miniature form is formed underlying said first opening and a wide trench miniature form is formed underlying said second opening, wherein the depth of said narrow contact hole miniature form is less than the depth of said wide trench miniature form;

forming a coating layer on said photo-resist and filling said narrow contact hole miniature form and said wide trench miniature form, where the depth of said coating layer on the bottom of said narrow contact hole miniature form is smaller than the depth of said coating layer on the bottom of said wide trench miniature form;

effecting an etching process to etch both said narrow contact hole miniature form and said wide trench miniature form, a narrow contact hole and a wide trench are formed in said dielectric layer and directly contact with said substrate, wherein a difference of etching rate between said narrow contact hole miniature form and said miniature of said wide trench is cancelled by a difference of depth of said coating layer between said bottom of said narrow contact hole miniature form and said bottom of said miniature of said wide trench, and the depth of said narrow contact hole is equal to the depth of said wide trench; and removing, said photo-resist.

2. The method according to claim 1, wherein said substrate comprises metal oxide semiconductor transistor and isolation.

3. The method according to claim 1, when said integrated circuit is a multi-layer integrated circuit, wherein said substrate further comprises a plurality of dielectric layers, a plurality of contacts and a plurality of interconnects.

4. The method according to claim 1, wherein thickness of said photo-resist is from about several angstroms to about several $\mu$ms.

5. The method according to claim 1, wherein the difference between the depth of said narrow contact hole miniature form and the depth of said wide trench miniature form is induced by the micro-loading effect.

6. The method according to claim 1, wherein said partial etching process is by etching part of said dielectric layer under both said first opening( and said second opening.

7. The method according to claim 1, wherein varieties of said coating layer comprises polymer and dielectric layer, wherein varieties of material of said polymer layer comprises carbon fluoride, carbon hydrogen fluoride and carbide.

8. The method according to claim 1, wherein method of forming said coating layer comprises a chemical vapor deposition.

9. A method for eliminating an etching microloading effect by an in situ polymer deposition and etching, comprises:

providing a semiconductor substrate covered by a dielectric layer:

forming a photo-resist on said dielectric layer;

effecting a photolithography process to form a wide opening and a narrow opening in said photo-resist, where each said opening directly contacts with said dielectric layer;

putting said semiconductor substrate in a plasma reactor with at least two independent power sources where a first power source is used to generate a plasma in said plasma reactor, and a second power source is used to induce a DC bias near a surface of said semiconductor substrate;

effecting a depositing process to deposit a polymer layer on said photo-resist and fill both said narrow opening and said wide opening, where owing to the characteristic of deposition, a depth of said polymer layer on a bottom of said narrow opening is smaller than a depth of said polymer layer on bottom of said wide opening; and effecting an etching process through said polymer layer, said photo-resist, and said dielectric layer to underlying said semiconductor substrate within said narrow opening and said wide opening, and then a narrow trench is formed under said narrow opening and a wide trench is formed under said wide trench, beside, period of said etching process and depth of said polymer layer is adjusted to let depth of said narrow trench is equal to depth of said wide trench.

10. The method according to claim 9, wherein said semiconductor substrate comprises metal oxide semiconductor transistor and isolation.

11. The method according to claim 9, wherein said substrate further comprises a plurality of dielectric layers, a plurality of contacts and a plurality of interconnects.

12. The method according to claim 9, wherein thickness of said photo-resist is from about several angstroms to about several It ms.

13. The method according to claim 9, wherein material of said polymer layer is selected from the group consisting of carbon fluoride, carbon hydrogen and carbide.

14. The method according to claim 9, wherein varieties of said first power source comprise radio frequency power of inductance coil and radio frequency power of capacitance plates.

15. The method according to claim 9, wherein variety of said second power source comprises radio frequency power of cathode.

16. The method according to claim 9, further comprises a partial etching process before said depositing process, said partial etching process is used to enhance aspect of both said wide opening and said narrow opening by etching part of said dielectric layer under both said wide opening and said narrow opening.

17. The method according to claim 9, wherein varieties of said semiconductor fabricating process comprise a local interconnects process and a dual damascene process, where both processes require to form smaller contact hole and larger open area with same depth.

18. The method according to claim 9, wherein a typical width of said narrowing opening is smaller than 0.3 $\mu$ms.

19. The method according to claim 9, wherein a typical width of said wide opening is larger than about 1 $\mu$ms.

* * * * *